United States Patent [19]
Hokari

[11] Patent Number: 5,654,565
[45] Date of Patent: Aug. 5, 1997

[54] CHARGE COUPLED DEVICE WITH FILLING FILM AND METHOD OF MANUFACTURE THEREOF

[75] Inventor: Yasuaki Hokari, Tokyo, Japan

[73] Assignee: NEC Corporation, Tokyo, Japan

[21] Appl. No.: 495,760

[22] Filed: Jun. 26, 1995

[30] Foreign Application Priority Data

Jun. 30, 1994 [JP] Japan .................................. 6-170473

[51] Int. Cl.$^6$ ................................................ H01L 27/148
[52] U.S. Cl. .......................... 257/222; 257/432; 257/644
[58] Field of Search ........................... 257/222, 223, 257/233, 432, 644

[56] References Cited

U.S. PATENT DOCUMENTS

| | | | |
|---|---|---|---|
| 4,782,037 | 11/1988 | Tomozawa et al. | 257/644 |
| 4,947,224 | 8/1990 | Kuroda et al. | 257/222 |
| 5,118,924 | 6/1992 | Mehra et al. | 257/222 |
| 5,241,198 | 8/1993 | Okada et al. | 257/222 |
| 5,288,656 | 2/1994 | Kusaka et al. | 257/233 |
| 5,289,017 | 2/1994 | Nii | 257/233 |
| 5,323,052 | 6/1994 | Koyama | 257/432 |
| 5,327,004 | 7/1994 | Kurusu et al. | 257/233 |
| 5,371,397 | 12/1994 | Maegawa et al. | 257/233 |
| 5,493,143 | 2/1996 | Hokari | 257/233 |

FOREIGN PATENT DOCUMENTS

| | | | |
|---|---|---|---|
| 0225563 | 8/1992 | Japan | 257/222 |
| 4218965 | 8/1992 | Japan . | |
| 0245679 | 9/1992 | Japan | 257/222 |
| 0263469 | 9/1992 | Japan | 257/222 |
| 0287372 | 10/1992 | Japan | 257/222 |
| 0291965 | 10/1992 | Japan | 257/222 |
| 0299862 | 10/1992 | Japan | 257/222 |

OTHER PUBLICATIONS

Proceedings of Spring Conference of the Applied Physics Society in Japan, No. 29p–D–9, 1985.

*Primary Examiner*—Tom Thomas
*Assistant Examiner*—David B. Hardy
*Attorney, Agent, or Firm*—Sughrue, Mion, Zinn, Macpeak & Seas

[57] ABSTRACT

A solid state image picking-up device such as a charge coupled device (CCD) includes a channel region and a photo-diode region formed on a semiconductor region apart from each other, a first insulating film formed on the semiconductor region including the channel region and the second semiconductor region to have a concave portion above the photo-diode region, and a charge transfer electrode interposed in said first insulating film and extending over the channel region and a region between the channel region and the photo-diode region. A light shielding film is formed on the first insulating film over the channel region and a second insulating film is formed on the light shielding film and the first insulating film. A protection film composed of BPSG or PSG is formed to fill the concave portion on the second insulating film. A third insulating film is formed on the protection film and a flattening resin film is formed on the third insulating film. The protection film is formed of a BPSG film containing $P_2O_5$ and $B_2O_3$ with the total density of 5 mol % or above or a PSG film containing $P_2O_5$ with the density of 5 mol % or above.

20 Claims, 6 Drawing Sheets

CHARGE COUPLED DEVICE WITH FILLING FILM AND METHOD OF MANUFACTURE THEREOF

BACKGROUND OF THE INVENTION

1. Field of the Invention

The present invention relates to a solid state image picking-up device, and more particularly, to a solid state image picking-up device in which defects (white dots or lines) can be prevented from being produced on an image picked up by the image picking-up device when high energy photons, such as in a radial ray, are input to the image picking-up device.

2. Description of Related Art

FIG. 1 is a schematic plan view showing a conventional solid state image picking-up device such as a charge coupled device (CCD). The CCD includes a photodiode 101 which performs photo-electronic conversion and a MOS transistor gate 105 which is provided for the photodiode 101 for reading out a block of signal charge stored in the photodiode 101. For each of a plurality of pixels, vertical CCD registers 102 are provided for the photodiodes 101 in a vertical direction, for transferring the blocks of signal charge read out by the MOS transistor gates 105 in a vertical direction, a horizontal CCD register 103 for transferring the blocks of signal charge transferred by the vertical CCD registers 102 in a horizontal direction, and an output section 4 for converting the blocks of signal charge transferred by the horizontal CCD register 103 into a voltage signal and outputting it.

Next, the operation of the conventional CCD will be described below. Light is inputted to the photodiode 101 through an optical system (not shown) and is subjected to photo-electron conversion to produce a block of signal charge therein. The produced block of signal charge is accumulated in the photodiode 101. After the accumulation of signal charge in the photodiode 101 is performed for a predetermined time period (e.g., 1/60th of a second), the MOS transistor gates 105 are activated for the respective photodiodes 101 at one time so that the blocks of signal charge are read out from the photodiodes 101 to the vertical CCD registers 102, as indicated by an arrow mark A. Each of the vertical CCD registers 102 transfers one block of signal charge to the horizontal CCD register 103 for every horizontal scanning period as indicated by an arrow mark B. Thus, the horizontal CCD register 103 receives the blocks of signal charge for one horizontal line from the vertical CCD registers 102 in parallel for each horizontal scanning period. Then, the horizontal CCD register 103 outputs the received blocks of signal charge to the output section 104 over the one horizontal scanning period. The output section 104 converts the blocks of signal charge for the one horizontal scanning period into an image signal for one horizontal line and outputs it.

FIG. 2 is a cross sectional view of the CCD of FIG. 1 taken along the line II—II. In FIG. 2, the CCD includes a p-type well region 121 formed on an n-type semiconductor (silicon) substrate 111. There are provided for each pixel in the well region 121 an n-type impurity region 113 for a photodiode, a p-type high density impurity region 125 which is provided on the surface of n-type impurity region 113, an n-type impurity region 115 for a CCD channel, and a p-type high density impurity region 123 for functioning as an isolating region of elements from each other. The CCD also includes a silicon oxide film 131 as a first insulating film formed on the well region 121, a charge transfer electrode 141 made of polycrystalline silicon and interposed in the first insulating film 131, an insulating film 136 as a second insulating film composed of a silicon oxide film, a light shielding film 151 provided above the charge transfer electrode 141 via the insulating film 136 to prevent incident light from inputting to the n-type impurity region 115 as the CCD channel, an insulting film 138 as a third insulating film formed of silicon oxide film ($SiO_2$). The CCD further includes a resin film 161 for flattening the surface of the third insulating film 138 and a microlens 171 formed on the resin film 161 for focusing the incident light in the n-type impurity region 113 for the photodiode. In this CCD, a vertical CCD register is constituted of the n-type impurity region 115 and the charge transfer electrode 141.

In the CCD having the structure shown in FIG. 2, the photodiode having a p-n junction is constituted of the n-type impurity region 113 and a p-type well region 121. Light incident to the n-type impurity region 113 along a path 181 is photo-electric converted to produce electron-hole pairs there. The produced electrons are stored in the n-type impurity region 113. The charge transfer electrode 141, the n-type impurity regions 113 and 115 constitutes a MOS transistor gate in which the electrode 141 and the n-type impurity regions 113 and 115 act as a gate electrode, source and drain regions, respectively. If the charge transfer electrode 141 is applied with a voltage pulse of 10 to 15 V, the electrons stored in the photodiode are read out to the CCD channel. Then, by sequentially applying voltage pulses having different phases to the charge transfer electrodes, the electrons are transferred in a direction perpendicular to the figure plane.

As described above, in the conventional CCD, a silicon oxide film is typically used as the second insulating film 136. Also, a film of metal such as aluminium (Al), tungsten (W) or a film of silicide such as MoSi and WSi is used as the light shielding film 151. The light shielding film is used as a wiring film at the peripheral of the device although it is not shown in the figure. When a portion having a large step is on the surface of second insulating film 136, breaking of the light shielding film and wiring film is often caused, and a non-etched portion remains after etching. As a result, the manufacturing yield of the device is reduced. A technique for preventing this is proposed in, for example, Japanese Laid Open patent Disclosure (JP-A-Hei4-218965) in which a BPSG film is used as the second insulating film 136 as shown in FIG. 5 of the reference. The BPSG film is a film in which phosphorus and boron are contained in $SiO_2$ and is softened and fluidized if it is heated to 800° to 900° C. Therefore, a gentle surface can be accomplished by filling the large step portion with the BPSG film and then by performing heat treatment. As a result, the breaking of the film such as the wiring film and shielding film can be prevented. That is, in the conventional CCD, the BPSG film is provided under the light shielding film.

The BPSG film can be readily fluidized as it contains more phosphorus and boron, so that the BPSG film surface can be made flat, gentle and smooth. However, if the BPSG film contains too much phosphorus and boron, phosphorus and boron diffuse toward the first insulating film 131 provided under the BPSG film, pass through the first insulating film 131, and reach the Si substrate or the p-type high density impurity region 125. As a result, the device can become inoperable. This phenomenon depends upon the thickness of the first insulating film and the density of boron/phosphorus in the BPSG film. Therefore, in this conventional CCD, the thickness of the first insulating film must be chosen to be 0.1 to 0.3 μm, and the density of boron/phosphorus in the BPSG film must be chosen to be in a range of 2 to 5%.

In a conventional solid state image picking-up device, an image defect such as white dots and lines on the picked up image is caused when high energy photons such as an X-ray and a radiation ray is irradiated to the device. This is because a large dark current is generated at particular pixels. As an example of circumstances in which the high energy photons are inputted to the device, there could be considered a monitor camera of an apparatus such as a X-ray imaging apparatus and radiation ray therapeutic apparatus in a medical field, a monitor camera in a nuclear energy field, and an observation camera in a space technology field. Since such an image defect degrades the image quality, there is the need for a solid state image picking-up device which has a resistance to high energy photons such as a radiation ray and an X-ray.

SUMMARY OF THE INVENTION

Therefore, the present invention has, as an object, to provide a solid state image picking-up device such as a charge coupled device (CCD) which has a resistance against high energy photons, and a method of manufacturing the same.

Another object of the present invention is to provide a solid state image picking-up device in which the operation can be stabilized when there is provided a BPSG or PSG film containing $P_2O_5$ and/or $B_2O_3$ with a high density, and a method of manufacturing the same.

Still another object of the present invention is to provide a solid state image picking-up device which can avoid a smear phenomenon.

In order to achieve an aspect of the present invention, a charge coupled device (CCD) includes a channel region formed on a semiconductor region, a photo-diode formed on a semiconductor region apart from the channel region, an insulating film formed on the semiconductor region including the channel region and the photodiode region to have a concave portion above the photo-diode region and to pass an incident light through to the photo-diode region, a charge transfer electrode interposed in the insulating film above the channel region and a region between the channel region and the photo-diode region, a light shielding film interposed in the insulating film above the charge transfer electrode, and a filling film filling the concave portion and passing the incident light through to the photo-diode region.

In order to achieve another aspect of the present invention, a solid state image picking-up device includes a light converting region formed on a semiconductor region, for converting an incident light into an amount of charge, and a protection film transparent to the incident light, formed above the light converting region and composed of a BPSG film or a PSG film, for functioning to quench pairs of electron and hole generated by high energy photons. The solid state image picking-up device may further include a channel region formed on the semiconductor region, an insulating film formed on the semiconductor region including the channel region and the light converting region to have a concave portion above the light converting region, the concave portion being filled with the protection film, a charge transfer electrode interposed in the insulating film above the channel region and a region between the channel region and the light converting region, and a light shielding film interposed in the insulating film above the charge transfer electrode.

The protection film or filling film has the thickness of a range of 0.5 to 1 μm and is formed of a BPSG film or a PSG film. Preferably, the BPSG film contains $P_2O_5$ and $B_2O_3$ with the total density of 5 mol % or above and the PSG film containing $P_2O_5$ with the density of 5 mol % or above. More preferably, the BPSG film contains $P_2O_5$ and $B_2O_3$ with the total density of about 10 mol % and the PSG film containing $P_2O_5$ with the density of about 10 mol %, in order to make the change amount of a flat band voltage $\Delta V_{FB}$ to set to approximately 0 V, thereby protecting any white line or stripe defect due to high energy photons on a picked-up image. In order to stabilize the operation of the device when such a protection or filling film is provide, an electrically conductive and optically transparent film may be further provided under to the second insulating film in contact with the light shielding film or on the protection or filling film. Note that an additional insulating film should be formed on the protection or filling film or the conductive and transparent film.

The light shielding film is preferably provided on the charge transfer electrode via the first insulating film having the film thickness of 0.1 to 0.2 μm. The light shielding film extends in parallel to the charge transfer electrode and has end portions extending downward to a level lower than the upper surface of the charge transfer electrode, thereby avoiding a smear phenomenon.

In order to achieve still another aspect of the present invention, a method of manufacturing a charge coupled device (CCD) includes the steps: providing a channel region and a photo-diode region formed on a semiconductor region apart from each other, a first insulating film formed on the semiconductor region including the channel region and the second semiconductor region to have a concave portion above the photo-diode region, and a charge transfer electrode interposed in the first insulating film and extending over the channel region and a region between the channel region and the photo-diode region; forming a light shielding film on the first insulating film over the channel region; forming a second insulating film on the light shielding film and the first insulating film; forming a protection film composed of BPSG or PSG to fill the concave portion on the second insulating film; and forming a flattening resin film.

The step of forming a protection film may include the steps of: coating a material containing silicon, phosphorus or boron over the second insulating film including the concave portion; performing heat treatment at a temperature of 400° to 500° C.; and forming a third insulating film on the protection film. Alternatively, the step of forming a protection film may includes he steps of: forming the protection film by a vapor deposition method at a temperature of 400° to 500° C.; coating a resist film on the protection film; and removing the resist film and a part of the protection film, when the light shielding film is made of a metal, or may include the steps of: forming the protection film by a vapor deposition method at a temperature of 400° to 500° C.; and performing heat treatment at a temperature of 800° to 900° C., when the light shielding film is made of a silicide.

DESCRIPTION OF THE PREFERRED EMBODIMENTS

A solid state image picking-up device according to the present invention will be described below with reference to the accompanying drawings, taking a charge coupled device (CCD) as an example.

Figure 1:
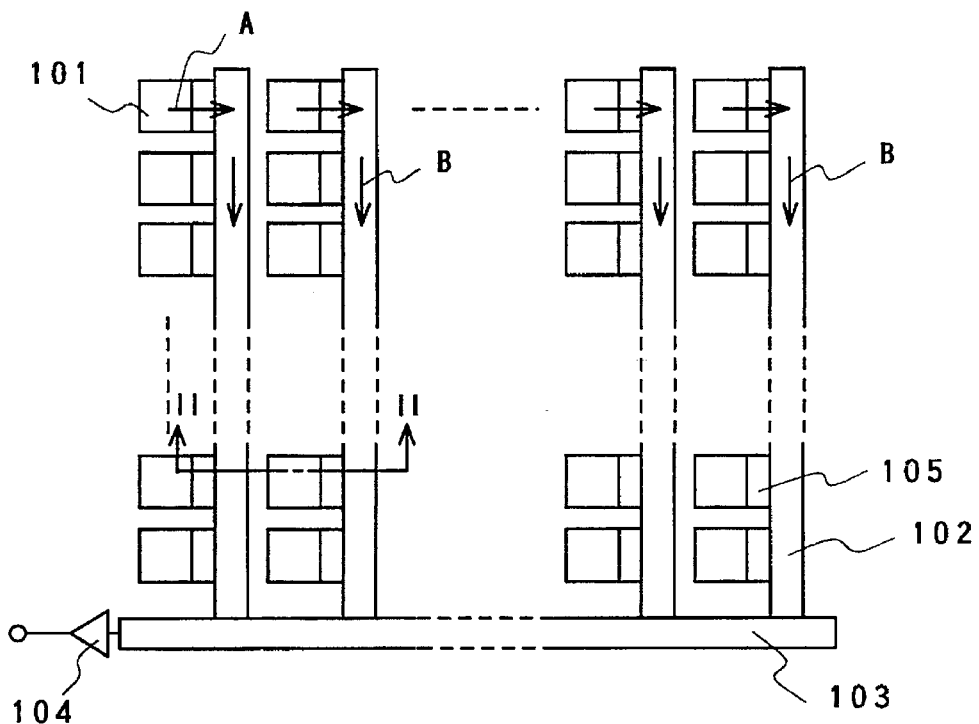
FIG. 1 is a schematic block diagram showing a conventional charge coupled device (CCD)
Figure 2:
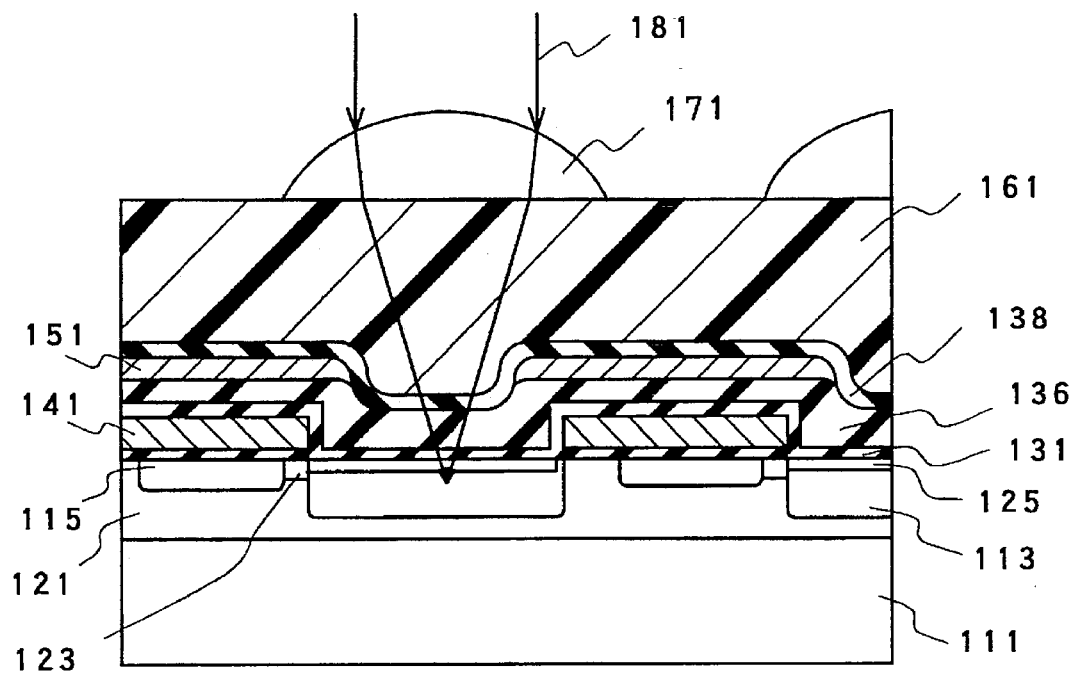
FIG. 2 is a cross sectional view showing the conventional CCD.
Figure 3:
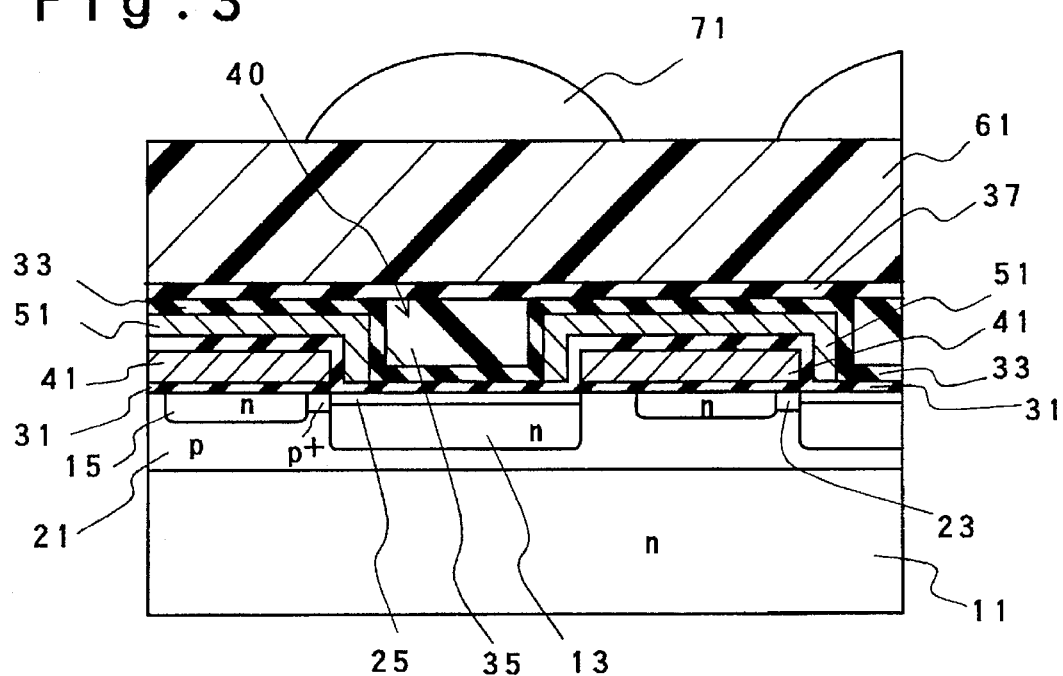
FIG. 3 is a cross sectional view of a CCD according to a first embodiment of the present invention.

First, referring to FIG. 3, the CCD according to a first embodiment of the present invention will be described below. FIG. 3 is a cross sectional view of the CCD for one pixel according to the first embodiment.

The CCD includes a p-type well region 21 formed on an n-type semiconductor (silicon) substrate 11. There are provided on the surface of well region 21 an n-type impurity region 13 for a photodiode region, an n-type impurity region 15 for a CCD channel, and a p-type high density impurity region 23 for isolating each of elements. The region 13, together with the well region 21, constitutes the photodiode to converts incident light to charges and stores the generated charges therein. A p-type high density impurity region 25 is provided on the surface of n-type impurity region 13 to suppress current generated at an interface between Si and $SiO_2$.

The CCD also includes a silicon oxide film 31 as a first insulating film formed on the whole surface of well region 21, including the regions 13, 15 and 23. To have a concave portion 40 above the photodiode region 13, a charge transfer electrode 41 is interposed in the silicon oxide film 31, a light shielding film 51 is provided above the charge transfer electrode 41 in the silicon oxide film 31, a second insulating film 33 is provided. A BPSG film 35 containing a high density of phosphorus (P) and/or boron (B) fills the concave portion 40. The charge transfer electrode 41 is made of polycrystalline silicon and has a width longer than that of the n-type impurity region 15 for the CCD channel to extend over the regions 15 and 23. Also, the light shielding film 51 is provided above the charge transfer electrode 41 via the silicon oxide film 31 and formed of polysilicon, metal or silicide. The light shielding film 51 has a main portion extending in a horizontal direction in parallel to the charge transfer electrode 41 to cover it, and end portions extending downward to a level lower than the upper surface of the charge transfer electrode 41 to prevent incident light from inputting to the n-type impurity region 15 as the CCD channel. The second insulating film 33 is formed of a silicon oxide film ($SiO_2$), a silicon nitride film ($SiN_4$) or a silicon oxide and nitride film (SiON). The BPSG film contains $P_2O_5$ and $B_2O_3$ with the total density of 5 mol % or above in this embodiment. Alternatively, a PSG film may be used which contains $P_2O_5$ with the density of 5 mol % or above.

The CCD further includes a third insulating film 37, a resin film 61 for covering the surface of third insulating film 37 to provide a flattened surface of the CCD and a microlens formed on the resin film 61. The third insulating film 33 is formed of a silicon oxide film ($SiO_2$), a silicon nitride film ($SiN_4$) or a silicon oxide and nitride film (SiON), and is formed on the second insulating film above the light shielding film 51 and on the BPSG film 35 above the photodiode region. The microlens 71 focuses incident light in the n-type impurity region 13 for the photodiode region. In this CCD, a vertical CCD register is constituted of the n-type impurity region 15 and the charge transfer electrode 41.

In the embodiment, the charge transfer electrode 41 is interposed in the first insulating film 31 formed of a silicon oxide film above the regions 15 and 23, and the light shielding film 51 is provided on the first insulating film 31.

However, in the conventional CCD disclosed in the JP-A-Hei4-218965, a BPSG film is interposed between the charge transfer electrode and the light shielding film. If the BPSG film is formed to be thick, an incident light from an oblique direction is readily to be inputted to the p-type well of the photodiode. When charge produced by the inputted light leaks into the CCD channel, a false signal is generated to cause a smear phenomenon. This can be observed as a defect on the picked up image, resulting in significant degradation of image quality.

In the present invention, the first insulating film 31 is formed between the charge transfer electrode 41 and the light shielding film 51 and has a thickness of about 0.1 to 0.2 μm. Therefore, such a smear phenomenon can be avoided. If the BPSG film is not interposed between the charge transfer electrode 41 and the light shielding film 51, breaking of the light shielding film 51 would be often caused and a non-etched portion would be often remained at the step portion of the first insulating film 31. In order to prevent such problems, it is sufficient that the charge transfer electrode 41 is formed to have a trapezoidal cross section or to be thin. However, even in the present invention, a BPSG film as thin as about 50 nm to 100 nm may be provided between the charge transfer electrode 41 and the light shielding film 51.

Next, the method of manufacturing the CCD according to the first embodiment will be described below with reference to FIGS. 4A to 4D. FIGS. 4A to 4D are cross sectional views of the CCD according to the first embodiment in the process of manufacturing the BPSG film and subsequent processes. For simplification of illustration, the respective portions of the semiconductor substrate are omitted.

Figure 4A:
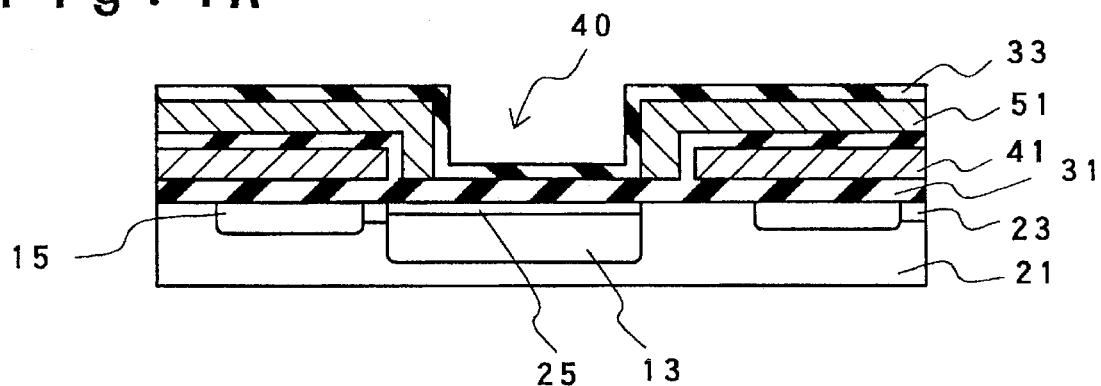
FIGS. 4A to 4D are cross sectional views of the CCD according to the first embodiment in the manufacturing process.

First, as shown in FIG. 4A, after the n-type impurity regions 13 and 15, the p-type impurity region 25, and the $p^+$-impurity region 23 are formed, a first silicon oxide film is formed on the well region 21 on the semiconductor substrate. Then, a polysilicon film is formed on the first silicon oxide film and patterned to form the charge transfer electrode 41. Subsequently, a second silicon oxide film is formed on whole surface. The first and second silicon oxide films constitute the first insulating film 31. As a result, the structure is obtained in which the charge transfer electrode 41 is interposed in the first insulating film 31. In the embodiment, the charge transfer electrode 41 is formed of two polysilicon layers although the process is not shown in the figure. Therefore, after the formation of the charge transfer electrode 41, the deep concave portion 40 is thereby formed above the photodiode region. Subsequently, the light shielding film 51, made of a metal, is formed to have the opening above the photodiode region and then the second insulating film 33 is formed of silicon oxide on the whole surface.

Figure 4B:
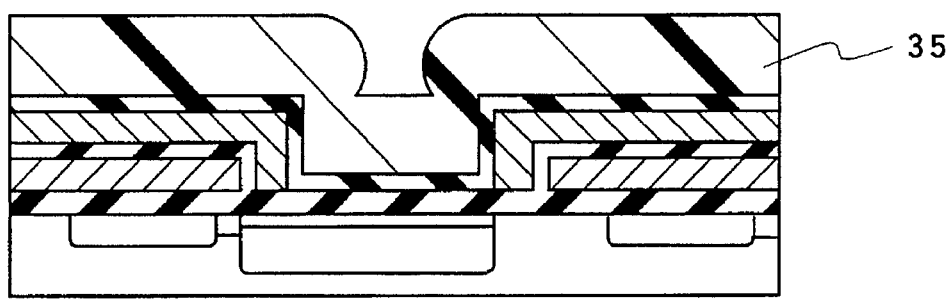

Next, as shown in FIG. 4B, the BPSG film 35 is formed by a vapor deposition method. The BPSG film 35 to be formed has a thickness at least as thick as the depth of the concave portion 40, i.e., about 0.5 to 1.5 μm. In a case where metal is used for the light shielding film 51, the BPSG film needs to be formed at a growing temperature of 400° to 500° C. Therefore, covering of the BPSG film is not good at such a low temperature deposition and a portion corresponding to the side wall of the concave portion 40 is formed to have an overhung shape.

Figure 4C:
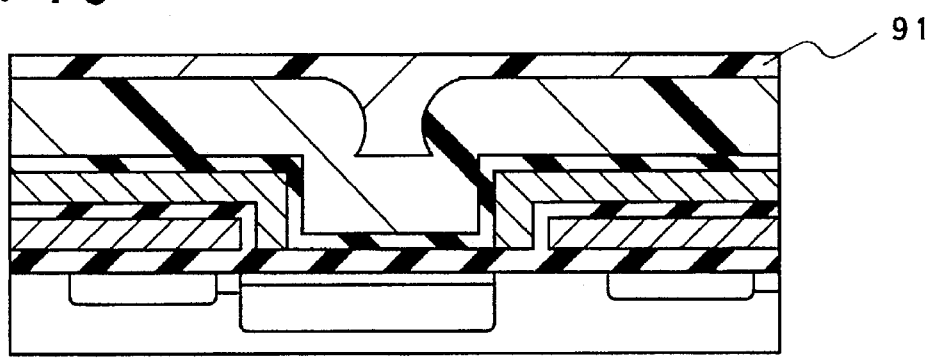

Next, as shown in FIG. 4C, a photoresist film 91 is coated to fill the concave portion of the BPSG film 35 and to cover the BPSG film 35. In this case, the concave portion above the photodiode region is filled with the photoresist whose surface is flat.

Figure 4D:
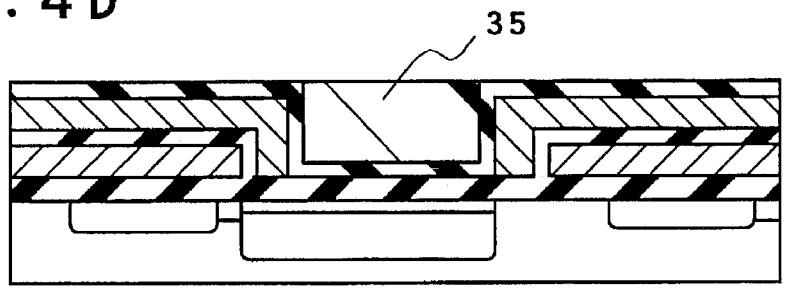

Next, as shown in FIG. 4D, the photoresist film is removed uniformly from the surface using a dry etching method. In the etching, even after the BPSG film 35 appears, the BPSG film 35 is further etched. As a result, only the BPSG film 35 filling the concave portion 40 remains. An abrading method may be employed to remove the BPSG film 35 in place of the dry etching method.

Next, although being not shown in the figures, the third insulating film 37 and the flattening resin film 61 are formed, in order, and finally the structure shown in FIG. 3 can be obtained. Thereafter, a lamp annealing method may be performed to the substrate at about 700° C. for a short time period so that the BPSG film 35 can be fluidized.

In a case where a silicide film is used as the light shielding film 51, after the BPSG film 35 is formed by the CVD method, the heat treatment may be performed at 800° to 900° C. to fill and flatten the concave portion 40 above the photodiode region. In this case, since the BPSG film 35 on the light shielding film 51 is fluidized and flows into the concave portion 40 above the photodiode region, the thickness of the BPSG film 35 may be 0.5 to 0.8 μm, which is less than the depth of the concave portion. In this case, the BPSG film 35 remains on the second insulating film 33 after the heat treatment, the remaining portion of the BPSG film may be left as it is or removed by a dry etching method.

Next, the BPSG film 35 will be described below. Conventionally, the mechanism in which a white line or stripe is caused due to high energy photons into the solid state image picking-up device was not necessarily manifest. On the other hand, it was known that the capability of a field oxidation film to isolate elements from each other was reduced due to high energy photons to increase a leak current, as described in, for example, paper in a Proceeding of Spring Conference of the Applied Physics Society in Japan (No. 29p-D-9 (1985)). According to this paper, the mechanism of degradation of the field oxidation film in characteristic due to the high energy photons is considered as follows. That is, when the high energy photons are inputted into a semiconductor integrated circuit device, pairs of electron and hole are generated in oxidation films and a Si region. The electrons and holes generated in the Si region diffuse a few tens of μm in the Si region and disappear by recombination. Therefore, damage is not permanent. On the other hand, a part of the pairs of electron and hole generated in the oxidation film recombines and disappear immediately. Also, the remaining part of electrons goes out of the oxidation film quickly because the electrons have a great mobility. However, the remaining part of holes is caught in the oxidation film and stay in the oxidation film for a long time because the holes have a small mobility. Thus, the holes are readily trapped in trap levels. Also, when the holes reach the interface of the Si region and the $SiO_2$ region, the holes form non-coupling bonds so that interface levels are increased. The holes trapped in the oxide film drop a threshold voltage of a layer under the field oxidation film to degrade isolation of elements from each other. Further, a current generated at the interface is increased due to the interface levels. The number of pairs of electron and hole generated in the oxidation film is substantially proportional to the thickness of the oxidation film. Therefore, the influence of high energy photons greatly appears in the field oxidation film which is formed of a thick silicon oxide film.

In the CCD, such a field oxidation film is not normally formed in a pixel region as shown in FIG. 3. However, a considerable thick oxidation film 35 having about 0.5 to 1 μm such as the BPSG film or the PSG film is formed in the opening of the light shielding film 51, i.e., above the photodiode region. The inventor of the present invention inferred that the white line or stripe defect due to high energy photons in the solid state image picking-up device is caused due to the same mechanism as in the field oxidation film. That is, holes generated by high energy photons are trapped in the thick oxidation film 35 above the photodiode region so that the interface levels are increased between the Si region and the thick oxidation film. The holes trapped in the oxidation film deplete the high density p-type impurity region 25 which is required to bury the photodiode region. Also, the increase of the interface levels between the Si region and the thick oxidation film increases a dark current. As a result, it is inferred that the white line or stripe defect is caused at the pixel portion to which high energy photons are irradiated.

Figure 5:
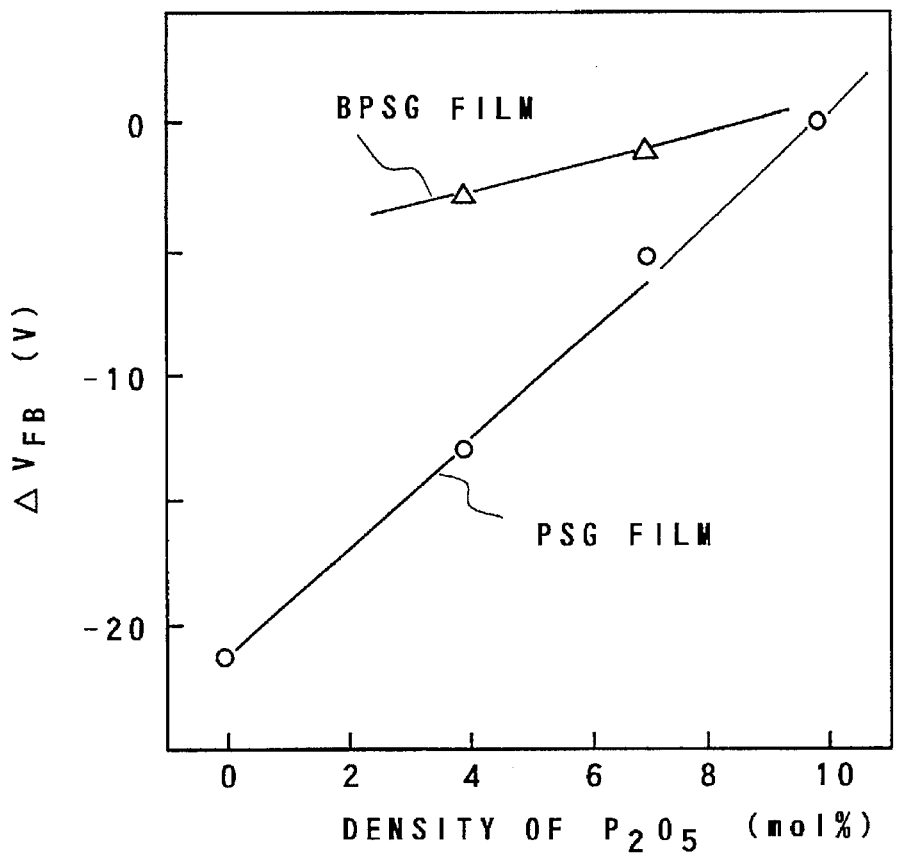
FIG. 5 is a graph showing a relation of density of $P_2O_5$ and the change amount of flat band voltage $\Delta V_{FB}$.

FIG. 5 shows the experiment result by the inventor. The experiment result indicates a relation of the phosphorus density in the oxidation film and a charge amount of flat band voltage ($\Delta V_{FB}$) after a radiation ray is irradiated to a MOS capacitor. As seen from the figure, in a case of either of the BPSG film or the PSG film, the change amount of flat band voltage ($\Delta V_{FB}$) is linearly decreased as the density of phosphorus is increased and $\Delta V_{FB}$ is substantially equal to zero when the density of phosphorus is 10 mol %. Since the BPSG film includes boron ($B_2O_3$ of 10 mol % in this example) other than phosphorus, the BPSG film can reduce the change amount of flat band voltage $\Delta V_{FB}$ to a value lower than a PSG film having the same phosphorus density. According to the experiment by the inventor, it was found that a PSG film having $P_2O_5$ of 5 mol % or above and a BPSG film having a total density of $P_2O_5$ and $B_2O_3$ of 5 mol % or above can suppress the generation of white line or stripe defect to a practicable level. Also, it was found that a PSG film having $P_2O_5$ of 10 mol % or above and a BPSG film having a total density of $P_2O_5$ and $B_2O_3$ of 10 mol % or above can substantially completely suppress the generation of white defect. Accordingly, in the CCD according to the present invention, a phosphorus non-doped insulating film is formed between the silicon substrate 11 or the well region 21 and the BPSG or PSG film 35. The phosphorus non-doped insulating film prevents impurity such as phosphorus and boron from diffusing from the BPSG or PSG film into the silicon substrate or the silicon region.

Next, the CCD according to another embodiment of the present invention will be described below with reference to FIGS. 6 and 7A and 7D.

Figure 6:
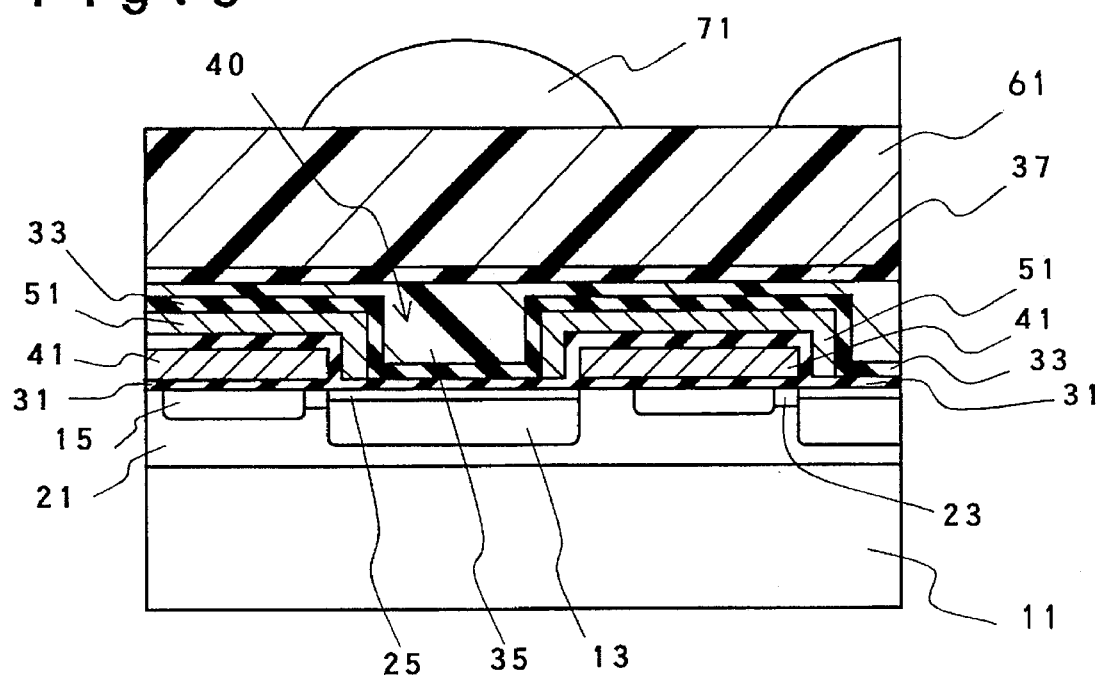
FIG. 6 is a cross sectional view of a CCD according to a second embodiment of the present invention.

FIG. 6 is a cross sectional view showing the CCD according to the second embodiment. In FIG. 6, the same components as shown in FIG. 3 are assigned with the same reference numerals and the description on these components will be omitted. The present embodiment is different from the above first embodiment in that the BPSG film 35 is formed not only in the concave portion 40 which is formed in the opening of the light shielding film 51 but also on the second insulating film 33. In the present embodiment, the white line or stripe defect due to a radiation ray can be also prevented because the BPSG film 35 has a thick film thickness, and the total density of $P_2O_5$ and $B_2O_3$ is 5 mol % or above.

Next, the method of manufacturing the CCD according to the second embodiment will be described below with reference to FIGS. 7A to 7D.

Figure 7A:
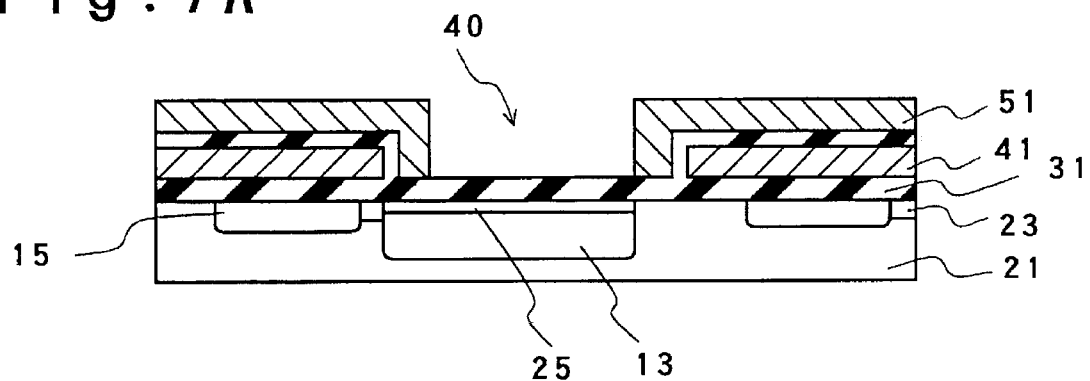
FIGS. 7A to 7D are cross sectional views of the CCD according to the second embodiment in the manufacturing process.

First, referring to FIG. 7A, the first insulting film 31 is formed on the well region 21 on the semiconductor substrate and the charge transfer electrode 41 is interposed in the first insulating film 31. In the embodiment, the charge transfer electrode 41 is formed of two polysilicon layers although the process is not shown. Therefore, after the formation of the charge transfer electrode 41, the deep concave portion 40 is thereby formed above the photodiode region. Subsequently, a metal film is deposited and patterned to form the light shielding film 51 to have the opening 40 above the photodiode region. That is, the light shielding film 51 is formed to have a main portion extending in a horizontal direction in parallel to the charge transfer electrode 41 above the regions 15 and 23, and end portions extending downward to a level lower than the upper surface of the charge transfer electrode 41.

Figure 7B:
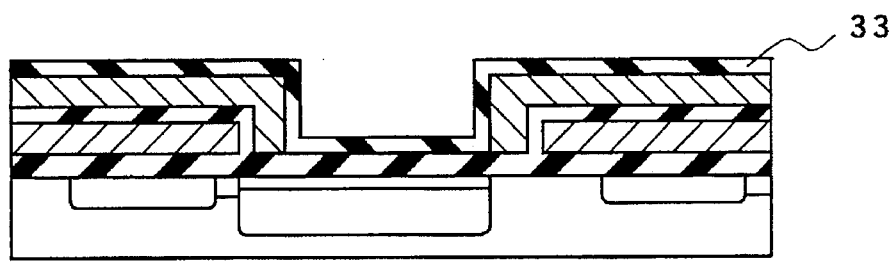

Next, as shown in FIG. 7B, the second insulating film 33 is formed on the whole surface, i.e., the light shielding film 51 and the first insulating film above the photodiode region.

Figure 7C:
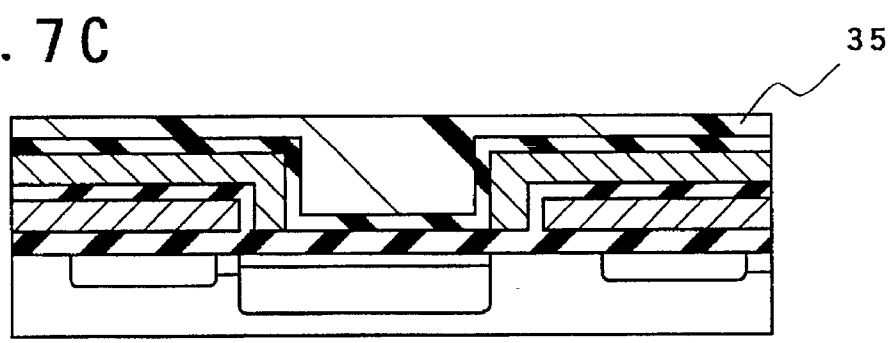

Next, as shown in FIG. 7C, the BPSG film 35 is formed by a coating method of liquid material in which phosphorus and/or boron are contained in an organic material including Si and O. The BPSG film 35 is provided on the second insulating film 33 to fill the opening of the light shielding film 51, or the concave portion 40 corresponding to the photodiode region, and to cover the whole second insulating film 33 Therefore, even if the depth of the concave portion 40 is as deep as about 1 μm, the concave portion 40 can be completely filled with the organic material and further the surface of the substrate can be flattened. Then, heat treatment is performed to the substrate at a temperature of 400° to 500° C. to volatilize the solvent and to dry the film.

Figure 7D:
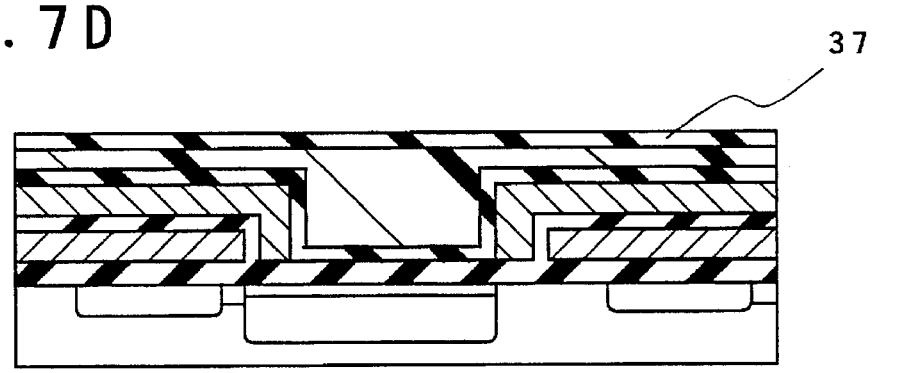

Next, as shown in FIG. 7D, the third insulating film 37 is formed of $SiO_2$, SiN and/or SiON as a cover film on the surface of BPSG film 35 to protect the BPSG film 35. This is because the BPSG film 35 produced in this manner has a great moisture absorption when the temperature of the heat treatment is low.

The subsequent processes are the same as in the first embodiment. Thus, the flattening resin film 61 can be readily formed in the second embodiment. Therefore, the embodiment has the advantage in that the process can be simplified.

Figure 8:
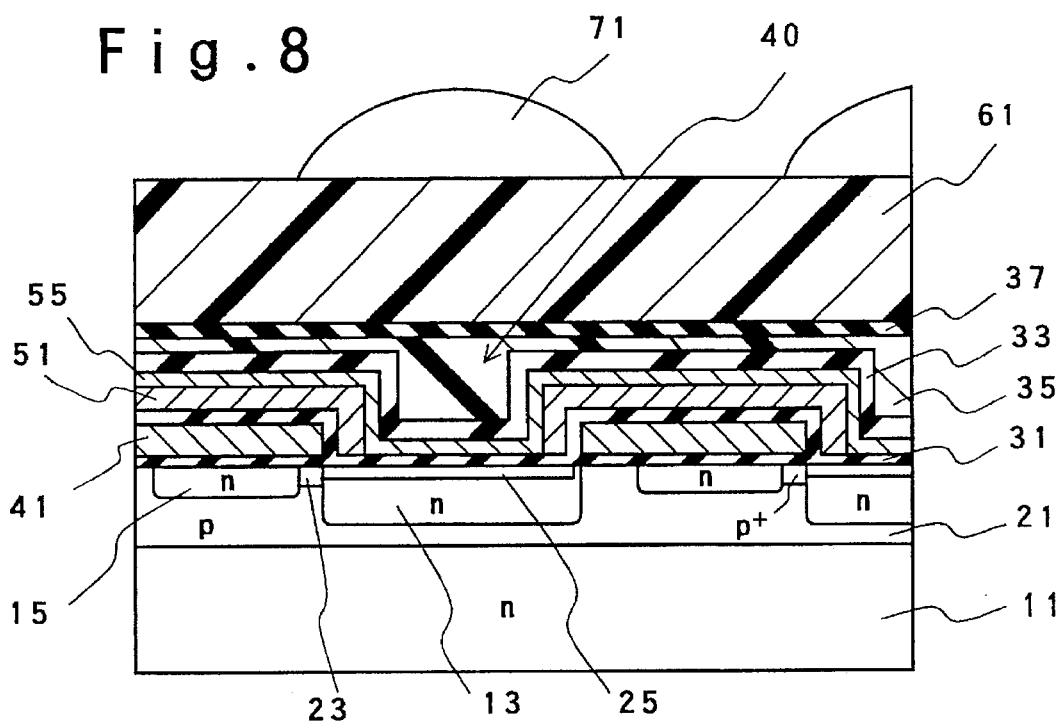
FIG. 8 is a cross sectional view showing a CCD according to a third embodiment of the present invention.

Next, the solid state image picking-up device according to a third embodiment of the present invention will be described with reference to FIG. 8. FIG. 8 is a cross sectional view showing a CCD according to the third embodiment. In FIG. 8, the same components as in FIG. 3 are assigned with the same reference numerals and the description will be omitted. The embodiment is different from the second embodiment in that an electrically conductive and optically transparent film 55 is formed on the light shielding film 51 and the first insulating film above the photodiode region. The conductive film 55 is provided to prevent the CCD from becoming instable in electrical characteristics. The conductive film 55 is connected to the light shielding film 51 and biased to a predetermined voltage, e.g., a voltage in the vicinity of 0 V. The conductive film 55 needs to be as transparent as possible so that the amount of incident light at the photodiode is not reduced. Therefore, the conductive film 55 is formed of polysilicon having a thickness of 20 to 50 nm, tin oxide or ITO. By employing the conductive film 55, since the holes moving toward the substrate surface can be caught by the conductive film 55, the generation of white line and stripe defect can be suppressed against the irradiation of a large amount of gamma rays, compared to the structures shown in the above embodiments. Also, the change of electrical characteristics can be suppressed to stabilize the operation.

Figure 9:
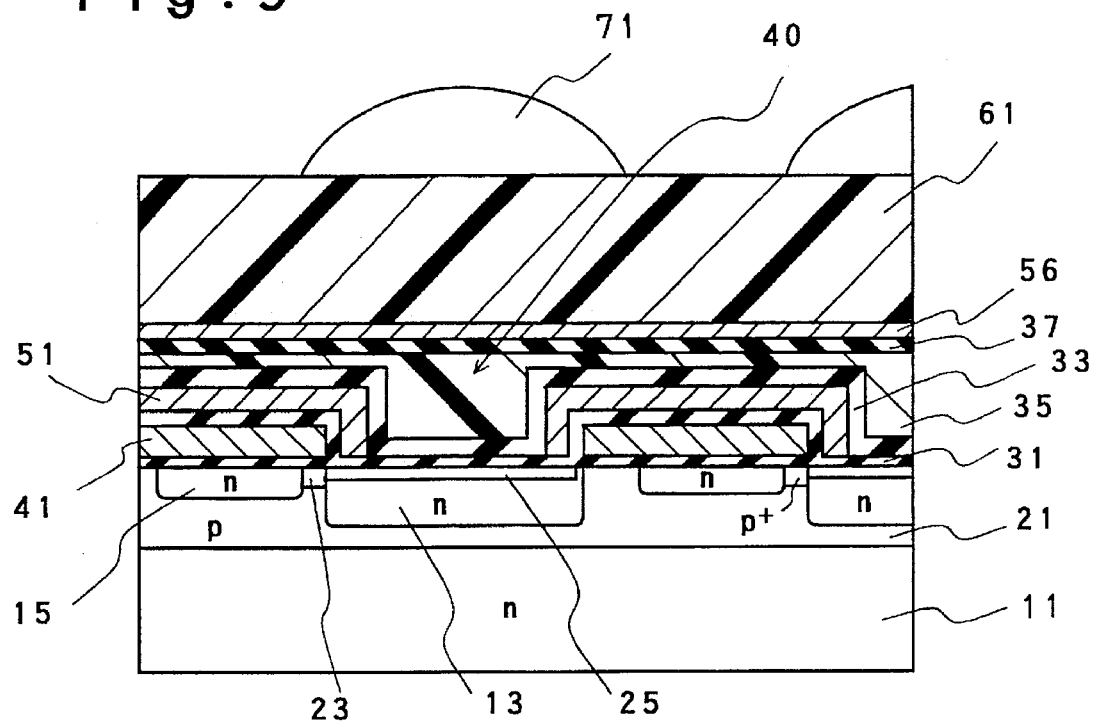
FIG. 9 is a cross sectional view showing a CCD according to a fourth embodiment of the present invention.

Next, the solid state image picking-up device according to a fourth embodiment of the present invention will be described with reference to FIG. 9. FIG. 9 is a cross sectional view showing a CCD according to the fourth embodiment. In FIG. 9, the same components as in FIG. 3 are assigned with the same reference numerals and the description will be omitted. The embodiment is different from the second embodiment in that an electrically conductive and optically transparent film 56 is formed on the third insulating film 37. The conductive film 56 is provided for the same purpose as that of the conductive film 55. Therefore, it is biased to a predetermined voltage, e.g., a voltage in the vicinity of 0 V. The conductive film 56 needs to be as transparent as possible so that light amount incident to the photodiode is not reduced.

As described above, according to the solid state image picking-up device of the present invention, since the BPSG or PSG film in which phosphorus is doped with a high density is formed above the photodiode region via the first and second insulating film, pairs of electron and hole generated when high energy photons such as a X-ray, a gamma ray and an alpha ray is irradiated can disappear quickly. Further, the density of the holes trapped in the BPSG or PSG film above the photodiode region can be reduced and the increase of the interface levels between Si and SiO2 can be suppressed. For this reasons, the dark current can be prevented from being increased so that the generation of white defect can be suppressed. Therefore, there can be achieved a camera having a long life and high reliability under the severe circumstances where a human being cannot remain for a long time, i.e., in space.

In addition, the device surface can be flattened after the BPSG or PSG film is formed. Therefore, the flattening resin film can be readily formed so that the manufacturing process can be simplified, resulting in reduced manufacturing cost.

What is claimed is:

1. A charge coupled device (CCD) comprising:

a first semiconductor region having a first conductive type;

a channel region and a second semiconductor region of a second conductive type formed on said first semiconductor region to have a gap, said first and second semiconductor regions constituting a light conversion region;

a first insulating film formed on said semiconductor region including said channel region and said second semiconductor region;

a charge transfer electrode interposed in said first insulating film and extending over said channel region and said gap;

a light shielding film formed on said first insulating film to extend at least over said channel region;

a second insulating film formed on said light shielding film and said first insulating film, raid second insulating film being disposed above all of said second semiconductor region; and a filling film filling at least a concave portion which is formed above said second semiconductor region by said first and second insulating films, said charge transfer electrode and said light shielding film, said filling film passing the incident light through to said light conversion region;

wherein said filling film is formed of at least one of a BPSG film and a PSG film.

2. The CCD according to claim 1, wherein said filling film is formed of said BPSG film containing $P_2O_5$ and $B_2O_3$ with the total density of at least 5 mol %.

3. The CCD according to claim 2, wherein said filling film suppresses a white line defect.

4. The CCD according to claim 1, wherein said filling film is formed of said PSG film containing $P_2O_5$ with the density of at least 5 mol %.

5. The CCD according to claim 4, wherein said filling film suppresses a white line defect.

6. A charge coupled device (CCD) comprising:

a first semiconductor region having a first conductive type;

a channel region and a second semiconductor region of a second conductive type formed on said first semiconductor region to have a gap, said first and second semiconductor regions constituting a light conversion region;

a first insulating film formed on said semiconductor region including said channel region and said second semiconductor region;

a charge transfer electrode interposed in said first insulating film and extending over said channel region and said gap;

a light shielding film formed on said first insulating film to extend at least over said channel region;

a second insulating film formed on said light shielding film and said first insulating film, said second insulating film being disposed above all of said second semiconductor region;

a filling film filling at least a concave portion which is formed above said second semiconductor region by said first and second insulating films, said charge transfer electrode and said light shielding film, said filling film passing the incident light through to said light conversion region; and an electrically conductive and optically transparent first film disposed under said second insulating film in contact with said light shielding film.

7. A charge coupled device (CCD) comprising:

a first semiconductor region having a first conductive type;

a channel region and a second semiconductor region of a second conductive type formed on said first semiconductor region to have a gap, said first and second semiconductor regions constituting a light conversion region;

a first insulating film formed on said semiconductor region including said channel region and said second semiconductor region;

a charge transfer electrode interposed in said first insulating film and extending over said channel region and said gap;

a light shielding film formed on said first insulating film to extend at least over said channel region;

a second insulating film formed on said light shielding film and said first insulating film, said second insulating film being disposed above all of said second semiconductor region;

a filling film filling at least a concave portion which is formed above said second semiconductor region by said first and second insulating films, said charge transfer electrode and said light shielding film, said filling film passing the incident light through to said light conversion region; and an electrically conductive and optically transparent film disposed above said filling film.

8. The CCD according to claim 7, wherein a third insulating film is formed at least on said filling film, and said electrically conductive and optically transparent film is formed on said third insulating film.

9. A charge coupled device (CCD) comprising:

a channel region formed on a semiconductor region;

a photo-diode formed on a semiconductor region apart from said channel region;

an insulating film formed on said semiconductor region including said channel region and said photodiode to have a concave portion above said photo-diode and to pass an incident light through to said photo-diode;

a charge transfer electrode interposed in said insulating film above said channel region and a region between said channel region and said photo-diode;

a light shielding film interposed in said insulating film above said charge transfer electrode, a thickness of said insulating film between said charge transfer electrode and said light shielding film being in a range of 0.1 to 0.2 μm; and a filling film filling said concave portion and passing the incident light through to said photo-diode.

10. The CCD according to claim 9, wherein said light shielding film extends in parallel to said charge transfer electrode and has end portions extending downward to a level lower than the upper surface of said charge transfer electrode.

11. A charge coupled device (CCD) comprising:

a channel region formed on a semiconductor region;

a photo-diode formed on a semiconductor region apart from said channel region;

an insulating film formed on said semiconductor region including said channel region and said photodiode to have a concave portion above said photo-diode and to pass an incident light through to said photo-diode;

a charge transfer electrode interposed in said insulating film above said channel region and a region between said channel region and said photo-diode;

a light shielding film interposed in said insulating film above said charge transfer electrode;

a filling film filling said concave portion and passing the incident light through to said photo-diode; and an electrically conductive and optically transparent film interposed in said insulating film in contact with said light shielding film.

12. The CCD according to claim 11, wherein said filling film further extends on said insulating film.

13. The CCD according to claim 11, wherein said filling film is formed of a BPSG film and a PSG film.

14. The CCD according to claim 11, wherein said filling film is formed of a BPSG film containing $P_2O_5$ and $B_2O_3$ with the total density of 5 mol % or above.

15. The CCD according to claim 11, wherein said filling film is formed of a PSG film containing $P_2O_5$ with the density of 5 mol % or above.

16. A solid state image picking-up device comprising:
   a light converting region formed on a semiconductor region, for converting an incident light into an amount of charge; and
   a protection film transparent to the incident light, formed above said light converting region, and composed of one of a BPSG film and a PSG film, for quenching electron-hole pairs generated by high energy photons;
   wherein said protection film has a thickness in a range of 0.5 to 1 µm.

17. The solid state image picking-up device according to claim 16, wherein said protection film is formed of one of:
   a BPSG film containing $P_2O_5$ and $B_2O_3$ with the total density of at least 5 mol %, and
   a PSG film containing $P_2O_5$ with the density of at least 5 mol %.

18. A solid state image picking-up device comprising:
   a light converting region formed on a semiconductor region, for converting an incident light into an amount of charge;
   a protection film transparent to the incident light, formed above said light converting region, and composed of one of a BPSG film and a PSG film, for quenching electron-hole pairs generated by high energy photons; and
   a conductive and transparent film formed under said protection film and biased to a predetermined potential.

19. The solid state image picking-up device according to claim 18, wherein said protection film is formed of one of:
   a BPSG film containing $P_2O_5$ and $B_2O_3$ with the total density of at least 5 mol %, and
   a PSG film containing $P_2O_5$ with the density of at least 5 mol %.

20. A solid state image picking-up device comprising:
   a light converting region formed on a semiconductor region, for converting an incident light into an amount of charge;
   a protection film transparent to the incident light, formed above said light converting region, and composed of one of a BPSG film and a PSG film, for quenching electron-hole pairs generated by high energy photons; and
   a conductive and transparent film formed on said protection film and biased to a predetermined potential.

* * * * *